US010600962B2

(12) United States Patent
Cho et al.

(10) Patent No.: US 10,600,962 B2
(45) Date of Patent: Mar. 24, 2020

(54) METHOD OF MANUFACTURING ORGANIC SEMICONDUCTOR THIN FILM USING BAR-COATING PROCESS AND METHOD OF FABRICATING FLEXIBLE ORGANIC SEMICONDUCTOR TRANSISTOR COMPRISING THE SAME

(71) Applicants: CENTER FOR ADVANCED SOFT ELECTRONICS, Pohang-si (KR); POSTECH ACADEMY-INDUSTRY FOUNDATION, Pohang-si (KR)

(72) Inventors: Kilwon Cho, Pohang-si (KR); Seon Baek Lee, Pohang-si (KR); Boseok Kang, Pohang-si (KR)

(73) Assignees: CENTER FOR ADVANCED SOFT ELECTRONICS, Pohang-si (KR); POSTECH ACADEMY—INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 16/189,897

(22) Filed: Nov. 13, 2018

(65) Prior Publication Data

US 2019/0378979 A1    Dec. 12, 2019

(30) Foreign Application Priority Data

Jun. 8, 2018 (KR) .................. 10-2018-0065956

(51) Int. Cl.
*H01L 51/00* (2006.01)
*H01L 51/05* (2006.01)

(52) U.S. Cl.
CPC ...... *H01L 51/0004* (2013.01); *H01L 51/0055* (2013.01); *H01L 51/0059* (2013.01);
(Continued)

(58) Field of Classification Search
CPC ............ H01L 51/0004; H01L 51/0541; H01L 51/0055; H01L 51/0074; H01L 51/0059; H01L 51/0097
See application file for complete search history.

(56) References Cited

U.S. PATENT DOCUMENTS 9,368,737 B2 *  6/2016  Hwang .............. H01L 51/0529
2006/0199037 A1 *  9/2006  Morii ................. H01L 51/5012
                                                                    428/690
(Continued)

FOREIGN PATENT DOCUMENTS

KR    1020130104472 A    9/2013

OTHER PUBLICATIONS

Dongyoon Khim et al., "Simple Bar-Coating Process for Large-Area, High-Performance Organic Field-Effect Transistor and Ambipolar Complementary Integrated Circuits", Advanced Materials, vol. 25, Wiley-VCH Verlag, pp. 4302-4308, 2013 (Year: 2013).*

(Continued)

*Primary Examiner* — William Coleman
(74) *Attorney, Agent, or Firm* — STIP Law Group, LLC

(57) ABSTRACT

Disclosed is a method of manufacturing an organic semiconductor thin film, including preparing semiconductor ink containing a solvent, a low-molecular-weight organic semiconductor and a high-molecular-weight organic semiconductor and forming an organic semiconductor thin film vertically phase-separated by applying the semiconductor ink on a substrate through a bar-coating process using a bar. In the bar-coating process of the invention, the semiconductor ink blend is used, and the gap between the substrate and the bar is adjusted, thus controlling vertical phase separation. Also, the speed of the bar, the gap of which is adjusted, is regulated, thus controlling crystal growth, whereby the uniformity of the thin film is improved and thus a high-quality organic semiconductor crystalline thin film having a (Continued)

large area can be manufactured in a continuous process. Also, a flexible organic semiconductor transistor, having high stability and high charge mobility, can be provided using the organic semiconductor thin film.

18 Claims, 8 Drawing Sheets

(52) U.S. Cl.
CPC ...... *H01L 51/0074* (2013.01); *H01L 51/0541* (2013.01); *H01L 51/0097* (2013.01)

(56) References Cited

U.S. PATENT DOCUMENTS

| | | | |
|---|---|---|---|
| 2006/0277651 A1* | 12/2006 | Razzaghi | A41D 13/0002 2/81 |
| 2013/0203198 A1* | 8/2013 | Min | H01L 51/428 438/46 |
| 2015/0003040 A1* | 1/2015 | Bessho | F21V 9/40 362/84 |

OTHER PUBLICATIONS

Sergi Riera-Galindo et al, Role of Polymorphism and Thin-Film Morphology in Organic Semiconductors Processed by Solution Shearing, ACS Omega, 2013, pp. 2329-2339, vol. 3, ACS Publications, Washington DC, USA.

\* cited by examiner

METHOD OF MANUFACTURING ORGANIC SEMICONDUCTOR THIN FILM USING BAR-COATING PROCESS AND METHOD OF FABRICATING FLEXIBLE ORGANIC SEMICONDUCTOR TRANSISTOR COMPRISING THE SAME

CROSS REFERENCE TO RELATED APPLICATION

The present application claims priority to Korean Patent Application No. 10-2018-0065956, filed Jun. 8, 2018, the entire contents of which is incorporated herein for all purposes by this reference.

BACKGROUND OF THE INVENTION

1. Technical Field

The present invention relates to a method of manufacturing an organic semiconductor thin film using a bar-coating process, and more particularly to a method of manufacturing an organic semiconductor thin film having high crystallinity and high mobility using a bar-coating process, in which a distance between a coating bar and a substrate and a speed of the coating bar are adjusted, thus controlling vertical phase separation of the semiconductor ink blend and the crystal growth of the thin film.

2. Description of the Related Art

Thorough research is ongoing these days into organic thin-film transistors (OTFT) that use organic semiconductors and are a driving device of a next-generation display. Organic thin-film transistors may be manufactured at low cost so as to realize mechanical flexibility and a large area, which are difficult to obtain using conventional silicon-based technologies. However, due to the poor electrical characteristics of organic semiconductor materials used in organic thin-film transistors, related studies have not yet entered the commercialization stage. Recently, organic semiconductor materials having high charge mobility have been developed, and low-molecular-weight organic semiconductor materials having high charge mobility, such as 2,7-dioctyl[1]benzothieno[3,2-b][1]benzothiophene (C8-BTBT), 2,8-difluoro-5,11-bis (triethylsilylethynyl) anthradithiophene (diF-TESADT), and dinaphtho [2,3-b:2',3'-f]thieno[3,2-b]thiophene (DNTT), are particularly receiving attention. These molecules have high charge mobility values while forming highly crystalline thin films due to the strong π-π interactions thereof, but it is known that the fabrication of high-quality thin films through solution processes is very difficult, attributable to the strong interactions and low viscosity thereof. Accordingly, liquid coating methods of low-molecular-weight semiconductor materials having high mobility have been developed in various ways, and several approaches have been proposed. Among them, a method of improving solution processability by blending a high-molecular-weight organic semiconductor with a low-molecular-weight semiconductor material is widely used. When the low-molecular-weight semiconductor ink is blended with the high-molecular-weight organic semiconductor, the viscosity of the solution may increase, and thus the overall processability of semiconductor ink is improved. Furthermore, vertical phase separation between the low-molecular-weight semiconductor and the high-molecular-weight organic semiconductor is induced to thus improve the thin-film crystallinity of the low-molecular-weight material, which consequently enables the growth of a thin film having high mobility. However, the ink blend is problematic in that the low-molecular-weight semiconductor/high-molecular-weight additive double-layer separation structure is not sufficiently formed through the conventional solution process, and the quality of the thin film is non-uniform due to the processing conditions. When the bar-coating process of the present invention is applied, it is easy to control the vertical phase separation of the low-molecular-weight semiconductor/high-molecular-weight additive, thereby making it possible to manufacture a highly crystalline organic semiconductor thin film having high mobility.

The development of a large-area printing process for organic semiconductor thin films is a prerequisite to the commercialization of organic-thin-film-transistor-based electronic devices. Conventional processes such as spin coating or inkjet printing have drawbacks in that they are difficult to use to manufacture a large-area thin film or cannot be applied to a roll-to-roll process. As a coating process that enables large-area coating with a highly crystalline low-molecular-weight organic semiconductor, bar coating, dip coating, blade coating and the like have been proposed. Among them, bar coating is an easy and cost-effective process for forming a large-area thin film and is also applicable to a roll-to-toll process, and is thus regarded as the closest to commercialization.

However, in the case of highly crystalline low-molecular-weight materials, it is difficult to obtain a uniform thin film through bar coating due to strong π-π interactions, and it is impossible to control a vertical phase separation phenomenon even when using high-molecular-weight organic semiconductors.

In the conventional bar-coating process, it is possible to manufacture a low-molecular-weight semiconductor thin film through blending with a high-molecular-weight additive, but it is difficult to precisely control vertical phase separation between the materials, and a uniform thin film cannot be obtained. Moreover, a flexible polymer substrate or a substrate having an electrode pattern formed thereon may be scratched because the coating bar is brought into close contact with the substrate.

SUMMARY OF THE INVENTION

Accordingly, the present invention has been made keeping in mind the problems encountered in the related art, and the present invention is intended to provide a bar-coating process, in which semiconductor ink containing a low-molecular-weight organic semiconductor having high charge mobility and a high-molecular-weight organic semiconductor is used and a gap between a substrate and a coating bar is adjusted, thereby controlling the vertical phase separation of the low-molecular-weight organic semiconductor and the high-molecular-weight organic semiconductor.

In addition, the present invention is intended to provide a bar-coating process, in which the speed of the coating bar, the gap of which is adjusted, is regulated, thus controlling crystal growth, thereby improving the uniformity of the thin film and consequently growing a highly crystalline thin film having a large area.

In addition, the present invention is intended to provide a flexible organic semiconductor transistor having high stability and high charge mobility using an organic semiconductor thin film, which is controlled in vertical phase separation of the semiconductor ink and in crystal growth.

Therefore, an aspect of the present invention provides a method of manufacturing an organic semiconductor thin film, comprising: (a) preparing semiconductor ink containing a solvent, a low-molecular-weight organic semiconductor and a high-molecular-weight organic semiconductor; and (b) forming an organic semiconductor thin film that is vertically phase-separated by applying the semiconductor ink on a substrate through a bar-coating process using a bar.

In step (b), the size of the gap between the bar and the substrate may be adjusted to thus control the vertical phase separation of the organic semiconductor thin film.

In step (b), a movement speed of the bar during the bar-coating process may be adjusted to thus control a crystal shape, a crystal size and/or a crystal growth rate of the organic semiconductor thin film.

In step (b), the movement speed of the bar during the bar-coating process may be adjusted to thus control the crystal growth of the organic semiconductor thin film and manufacture a high-quality crystal product in a continuous process.

Step (b) may include (b-1) performing coating at a movement speed of the bar ranging from 0.1 to 2 mm/sec (v1) during the bar-coating process; and (b-2) stopping movement of the bar after step (b-1) or performing coating at a movement speed of the bar ranging from 0.01 to 0.05 mm/sec.

Here, steps (b-1) and (b-2) may be sequentially or continuously repeated.

The organic semiconductor thin film may comprise: a high-molecular-weight organic semiconductor layer formed on the substrate and configured to contain a high-molecular-weight organic semiconductor; and a low-molecular-weight organic semiconductor layer formed on the high-molecular-weight organic semiconductor layer and configured to contain a low-molecular-weight organic semiconductor, the low-molecular-weight organic semiconductor layer being crystalline.

The thickness, the flow rate and the phase separation of the semiconductor ink may be controlled depending on the size of the gap.

The size of the gap may be 0.01 to 10 μm.

The speed of the bar during the bar-coating process may be 0.05 to 2 mm/sec.

In step (b), vertical phase separation and crystal growth may occur while the solvent of the semiconductor ink evaporates.

The crystal growth rate may be controlled by adjusting the evaporation rate of the solvent.

The crystals having a large crystal size may be grown with a decrease in the evaporation rate of the solvent.

The crystals of the low-molecular-weight organic semiconductor may be arranged in the direction of movement of the bar.

The vertical phase separation may be controlled using the difference between the surface energy of the low-molecular-weight organic semiconductor and the surface energy of the high-molecular-weight organic semiconductor. The substrate is hydrophilic, a first organic semiconductor layer containing an organic semiconductor having relatively high surface energy among the high-molecular-weight organic semiconductor and the low-molecular-weight organic semiconductor may be formed on the substrate, and a second organic semiconductor layer containing an organic semiconductor having relatively low surface energy may be formed on the first organic semiconductor layer, or the substrate is hydrophobic, a second organic semiconductor layer containing an organic semiconductor having relatively low surface energy among the high-molecular-weight organic semiconductor and the low-molecular-weight organic semiconductor may be formed on the substrate, and a first organic semiconductor layer containing an organic semiconductor having relatively high surface energy may be formed on the second organic semiconductor layer.

In order to form the low-molecular-weight organic semiconductor layer on the high-molecular-weight organic semiconductor layer, the surface energy of the low-molecular-weight organic semiconductor may be lower than the surface energy of the high-molecular-weight organic semiconductor.

In order to form the high-molecular-weight organic semiconductor layer on the low-molecular-weight organic semiconductor layer, the surface energy of the low-molecular-weight organic semiconductor may be higher than the surface energy of the high-molecular-weight organic semiconductor.

The low-molecular-weight organic semiconductor may have a molecular weight of 50 to 1,000.

The high-molecular-weight organic semiconductor may have a molecular weight of 2,000 to 1,000,000.

The low-molecular-weight organic semiconductor may be a compound represented by Structural Formula 1 below.

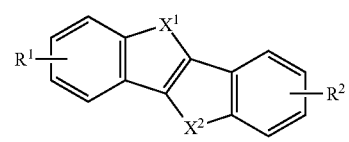

[Structural Formula 1]

In Structural Formula 1, $X^1$ and $X^2$ are the same as or different from each other, and are each independently an oxygen (O), sulfur (S), nitrogen (N), phosphorus (P) or selenium (Se) atom, and $R^1$ and $R^2$ are the same as or different from each other, and are each independently a hydrogen atom, a C1 to C30 linear or branched alkyl group, or a C6 to C30 aryl group.

The low-molecular-weight organic semiconductor may include at least one selected from among a pentacene derivative compound and a TES-ADT (5,11-bis(triethylsilylethynyl) anthradithiophene) derivative compound.

The high-molecular-weight organic semiconductor may be a compound represented by Structural Formula 2 below.

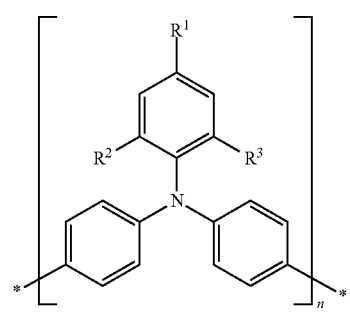

[Structural Formula 2]

In Structural Formula 2, $R^1$ to $R^3$ are the same as or different from each other, and are each independently a hydrogen atom, a C1 to C30 linear or branched alkyl group, or a C6 to C30 aryl group, $R^4$ and $R^5$ are the same as or different from each other, and are each independently a hydrogen atom, a C1 to C30 linear or branched alkyl group, or a C6 to C30 aryl group, and n is any one integer of 1 to 50.

The high-molecular-weight organic semiconductor may be an amorphous high-molecular-weight organic semiconductor.

The high-molecular-weight organic semiconductor may include at least one selected from among poly(triaryl amine) (PTAA), indacenodithiophene-co-benzothiadiazole (IDT-BT), and poly(9,9-dioctylfluorene-alt-bithiophene) (F8T2).

The low-molecular-weight organic semiconductor and the high-molecular-weight organic semiconductor may be mixed at a ratio of 1:10 to 10:1.

As the size of the grown crystals is larger, charge mobility may increase.

Another aspect of the present invention provides a method of fabricating an organic semiconductor transistor including the method of manufacturing the organic semiconductor thin film.

Still another aspect of the present invention provides a method of fabricating an organic transistor, comprising: (a) preparing semiconductor ink containing a solvent, a low-molecular-weight organic semiconductor and a high-molecular-weight organic semiconductor; (b) providing a substrate and forming source and drain electrodes on the substrate; (c) forming an organic semiconductor thin film that is vertically phase-separated by applying the semiconductor ink on the substrate having the source and drain electrodes formed thereon through a bar-coating process using a bar; (d) forming an insulating layer on the organic semiconductor thin film; and (e) forming a gate electrode on the insulating layer.

In a bar-coating process according to the present invention, semiconductor ink containing a low-molecular-weight organic semiconductor having high charge mobility and a high-molecular-weight organic semiconductor, which are mixed together, is used, and the gap between a substrate and a coating bar is adjusted, thus controlling the vertical phase separation of the low-molecular-weight organic semiconductor and the high-molecular-weight organic semiconductor.

Also, the speed of the coating bar, the gap of which is adjusted, is regulated, thus controlling crystal growth, whereby the uniformity of the thin film is improved and thus a high-quality organic semiconductor crystalline thin film having a large area can be manufactured in a continuous process.

Also, a flexible organic semiconductor transistor, having high stability and high charge mobility, can be provided using an organic semiconductor thin film, which is controlled in vertical phase separation of the semiconductor ink and in crystal growth.

DESCRIPTION OF SPECIFIC EMBODIMENTS

The present invention may be embodied in many different forms, and should not be construed as being limited only to the embodiments set forth herein, but should be understood to cover all modifications, equivalents or alternatives falling within the spirit and technical scope of the present invention. In the description of the present invention, detailed descriptions of related known techniques incorporated herein will be omitted when the same may make the gist of the present invention unclear.

As used herein, the terms "first", "second", etc. may be used to describe various elements, but these elements are not to be limited by these terms. These terms are only used to distinguish one element from another. For example, a first element may be termed a second element, and similarly, a second element may be termed a first element, without departing from the scope of the present invention.

Further, it will be understood that when an element is referred to as being "formed" or "stacked" on another element, it can be formed or stacked so as to be directly attached to all surfaces or one surface of the other element, or intervening elements may be present therebetween.

Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional possible presence of one or more different features, numbers, steps, operations, elements, parts, or combinations thereof.

The present invention pertains to a method of forming an organic semiconductor thin film using a bar-coating process.

Figure 1:
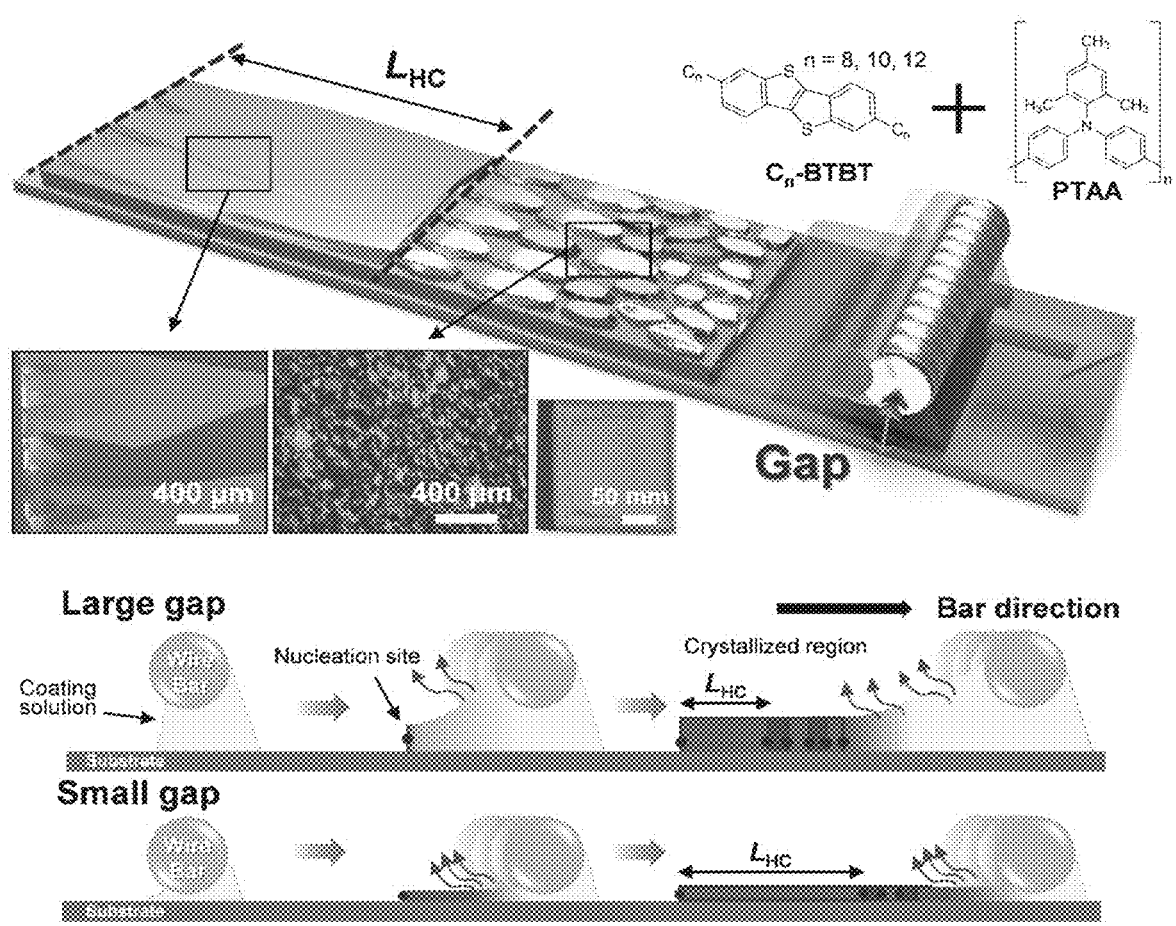
FIG. 1 schematically shows a process of forming a film using a wire bar-coating process according to the present invention and depending on the size of a gap, and polarized optical microscopy (POM) images of bar-coated crystals.

FIG. 1 shows a process of forming an organic semiconductor thin film using a bar-coating process according to the present invention and a thin-film formation process depending on the size of a gap.

Below is a description of a method of manufacturing an organic semiconductor thin film according to the present invention, made with reference to FIG. 1.

First, semiconductor ink containing a solvent, a low-molecular-weight organic semiconductor and a high-molecular-weight organic semiconductor is prepared (step a).

The solvent may include 1,2-dichlorobenzene, chlorobenzene, toluene, trichlorobenzene, tetralin, tetrahydrofuran (THF), chloroform, etc. Preferably, 1,2-dichlorobenzene or chlorobenzene is used, and more preferably, chlorobenzene is used.

The surface energy of the low-molecular-weight organic semiconductor may be higher than the surface energy of the high-molecular-weight organic semiconductor.

The low-molecular-weight organic semiconductor has a molecular weight of 50 to 1,000, preferably 50 to 800, and more preferably 100 to 700.

The high-molecular-weight organic semiconductor has a molecular weight of 2,000 to 1,000,000, preferably 4,000 to 800,000, and more preferably 5,000 to 100,000.

The low-molecular-weight organic semiconductor may be the compound represented by Structural Formula 1 below.

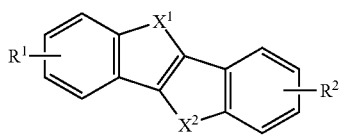

[Structural Formula 1]

In Structural Formula 1, $X^1$ and $X^2$ are the same as or different from each other, and are each independently an oxygen (O), sulfur (S), nitrogen (N), phosphorus (P) or selenium (Se) atom, and $R^1$ and $R^2$ are the same as or different from each other, and are each independently a hydrogen atom, a C1 to C30 linear or branched alkyl group, or a C6 to C30 aryl group.

$X^1$ and $X^2$ are the same as or different from each other, and are each independently an oxygen (O), sulfur (S), nitrogen (N), or selenium (Se) atom, and preferably a sulfur atom.

Structural Formula 1 is preferably the compound represented by Chemical Formula 1 below.

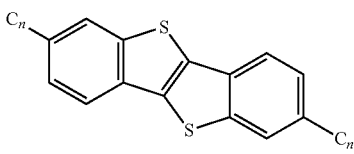

[Chemical Formula 1]

In Chemical Formula 1, n is 8, 10 or 12, and preferably n is an integer of 8.

The low-molecular-weight organic semiconductor may include a BTBT-based derivative compound, a pentacene derivative compound, or a TESADT derivative compound, as represented by Structural Formula 1.

The high-molecular-weight organic semiconductor may be the compound represented by Structural Formula 2 below.

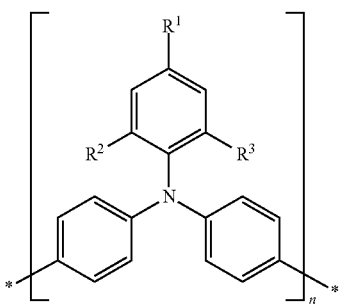

[Structural Formula 2]

In Structural Formula 2, $R^1$ to $R^3$ are the same as or different from each other, and are each independently a hydrogen atom, a C1 to C30 linear or branched alkyl group, or a C6 to C30 aryl group, $R^4$ and $R^5$ are the same as or different from each other, and are each independently a hydrogen atom, a C1 to C30 linear or branched alkyl group, or a C6 to C30 aryl group, and n is any one integer of 1 to 50.

The high-molecular-weight organic semiconductor may include poly(triaryl amine) (PTAA), indacenodithiophene-co-benzothiadiazole (IDT-BT), poly(9,9-dioctylfluorene-alt-bithiophene) (F8T2), etc., and preferably poly(triaryl amine) (PTAA) is used.

The high-molecular-weight organic semiconductor may be an amorphous high-molecular-weight organic semiconductor. The amorphous high-molecular-weight organic semiconductor functions to minimize the interruption of crystal growth of the low-molecular-weight organic semiconductor in the course of drying the thin film, thereby forming a semiconductor thin film having high charge mobility.

Also, when the energy level of the high-molecular-weight organic semiconductor is adjusted, it may be used as a charge injection layer in the organic transistor device.

The low-molecular-weight organic semiconductor and the high-molecular-weight organic semiconductor may be mixed at a ratio of 1:10 to 10:1, and preferably the low-molecular-weight organic semiconductor and the high-molecular-weight organic semiconductor are mixed at a ratio of 3:2 or 7:3.

The amount of the solvent is set such that the solution containing the mixture of the low-molecular-weight organic semiconductor and the high-molecular-weight organic semiconductor has a concentration of 2.0 wt %, thereby preparing the semiconductor ink. The concentration of the solution containing the mixture of the low-molecular-weight organic semiconductor and the high-molecular-weight organic semiconductor is not limited thereto, and the semiconductor ink may be prepared such that the concentration of the solution is 1.0 or 1.5 wt % depending on the kind of the low-molecular-weight material.

Finally, the semiconductor ink is applied on a substrate through a bar-coating process using a bar, thus forming an organic semiconductor thin film that is vertically phase-separated (step b).

In step (b), the organic semiconductor thin film may be manufactured in a continuous process in a coating direction.

Step (b) may be performed in two steps.

Specifically, coating is performed at a movement speed of the bar ranging from 0.1 to 2 mm/sec (v1) during the bar-coating process (step b-1).

Next, the movement of the bar may be stopped after step (b-1), or coating may be performed at a movement speed of the bar ranging from 0.01 to 0.05 mm/sec (step b-2).

Here, steps (b-1) and (b-2) may be sequentially or continuously repeated.

The organic semiconductor thin film includes a high-molecular-weight organic semiconductor layer, formed on the substrate and configured to contain a high-molecular-weight organic semiconductor, and a low-molecular-weight organic semiconductor layer, formed on the high-molecular-weight organic semiconductor layer and configured to contain a low-molecular-weight organic semiconductor, the low-molecular-weight organic semiconductor layer being crystalline.

The size of the gap between the bar and the substrate may be adjusted, thus controlling the vertical phase separation of the organic semiconductor thin film.

Also, the movement speed of the bar during the bar-coating process may be adjusted, and thus a crystal shape, a crystal size and/or a crystal growth rate of the organic semiconductor thin film may be controlled, and a high-quality crystal product may be manufactured in a continuous process.

The organic semiconductor thin film may be a double layer configured such that the low-molecular-weight organic semiconductor is formed on the high-molecular-weight organic semiconductor.

The high-molecular-weight organic semiconductor layer of the double layer formed through vertical phase separation facilitates charge injection from the source electrode of the transistor into the low-molecular-weight organic semiconductor layer, and functions to reduce contact resistance.

Also, the organic semiconductor thin film may be a double layer such that the high-molecular-weight organic semiconductor is formed on the low-molecular-weight organic semiconductor.

The thickness, the flow rate, and the phase separation of the semiconductor ink may be controlled depending on the size of the gap.

The vertical phase separation of the low-molecular-weight organic semiconductor and the high-molecular-weight organic semiconductor contained in the semiconductor ink may be controlled through the gap, and the gap causes changes in the flow of the solvent in the applied solution to thus facilitate the phase separation of the low-molecular-weight organic semiconductor and the high-molecular-weight organic semiconductor.

The thickness of the applied solution and the flow rate in the solution vary depending on the size of the gap, which consequently causes a difference in the extent of vertical phase separation of two materials having different surface energy values and viscosity values. The organic semiconductor thin film manufactured at the optimal gap has a double-layer structure of low-molecular-weight organic semiconductor layer/high-molecular-weight organic semiconductor layer, and is thus suitable for lateral charge transfer, which is favorable for driving an organic field-effect transistor.

The size of the gap is 0.01 to 10 μm, preferably 0.05 to 5.0 μm, and more preferably 0.1 to 2.0 μm.

The vertical phase separation effect may increase with a decrease in the size of the gap.

The vertical phase separation is controlled using the difference between the surface energy of the low-molecular-weight organic semiconductor and the surface energy of the high-molecular-weight organic semiconductor. The substrate is hydrophilic, a first organic semiconductor layer containing an organic semiconductor having relatively high surface energy, among the high-molecular-weight organic semiconductor and the low-molecular-weight organic semiconductor, may be formed on the substrate, and a second organic semiconductor layer containing an organic semiconductor having relatively low surface energy may be formed on the first organic semiconductor layer. Alternatively, the substrate is hydrophobic, a second organic semiconductor layer containing an organic semiconductor having relatively low surface energy, among the high-molecular-weight organic semiconductor and the low-molecular-weight organic semiconductor, may be formed on the substrate, and a first organic semiconductor layer containing an organic semiconductor having relatively high surface energy may be formed on the second organic semiconductor layer.

In order to form the low-molecular-weight organic semiconductor layer on the high-molecular-weight organic semiconductor layer, the surface energy of the low-molecular-weight organic semiconductor may be lower than that of the high-molecular-weight organic semiconductor.

In order to form the high-molecular-weight organic semiconductor layer on the low-molecular-weight organic semiconductor layer, the surface energy of the low-molecular-weight organic semiconductor may be higher than that of the high-molecular-weight organic semiconductor.

In the bar-coating process, the speed of the bar is 0.05 to 2 mm/sec, preferably 0.1 to 2 mm/sec, and more preferably 0.2 to 2 mm/sec.

In step (b), vertical phase separation and crystal growth may occur while the solvent of the solution evaporates.

The crystal growth rate may be controlled by adjusting the evaporation rate of the solvent, and crystals having a large crystal size may be grown with a decrease in the evaporation rate of the solvent.

The crystals of the low-molecular-weight organic semiconductor may be arranged in the direction of movement of the bar.

In the conventional bar-coating process, the growth of crystals is initiated at various parts of the applied solution because of the high evaporation rate of the solvent after coating, which results in a decrease in the crystal size of the low-molecular-weight organic semiconductor after drying the thin film. In order to prevent the formation of additional crystal growth points, the crystal growth rate and the solvent evaporation rate should be similar to each other. This suppresses the "slippage" phenomenon of the droplet-drying line during thin-film formation to thus allow large crystals to grow.

In the present invention, the speed of the coating bar is programmed, thereby enabling continuous production of a highly crystalline thin film without causing a "slippage" phenomenon even at a processing speed suitable for an industrial process.

The larger the crystal size, the higher the charge mobility. Therefore, the solvent evaporation rate may be controlled by adjusting the speed of the wire bar, thus increasing the crystal size.

The crystal size may fall in the range of 1 mm to 5 mm.

In addition, the present invention pertains to a method of fabricating an organic semiconductor transistor including the method of manufacturing the organic semiconductor thin film.

According to the present invention, the method of fabricating an organic transistor includes (a) preparing semiconductor ink containing a solvent, a low-molecular-weight organic semiconductor and a high-molecular-weight organic semiconductor, (b) providing a substrate and forming source and drain electrodes on the substrate, (c) forming an organic semiconductor thin film that is vertically phase-separated by applying the semiconductor ink on the substrate having the source and drain electrodes formed thereon through a bar-coating process using a bar, (d) forming an insulating layer on the organic semiconductor thin film, and (e) forming a gate electrode on the insulating layer.

The insulating layer may be formed of poly(perfluorobutenylvinylether) (Cytop), Parylene, poly(methyl methacrylate) (PMMA), poly(styrene) (PS), etc., and preferably poly(perfluorobutenylvinylether (Cytop) and Parylene are used.

The insulating layer may have a stack structure configured such that Parylene is formed on Cytop.

A better understanding of the present invention will be given through the following examples, which are merely set forth to illustrate the present invention but are not to be construed as limiting the scope of the present invention.

EXAMPLES

Preparation Example 1: Preparation of Semiconductor Ink

As a low-molecular-weight organic semiconductor, C8-BTBT (2,7-dioctyl[1]benzothieno[3,2-b][1]benzothiophene, molecular weight: 464.77) and, as a high-molecular-weight organic semiconductor, PTAA (poly[bis(4-phenyl)(2,4,6-trimethylphenyl)amine], molecular weight: 7,000 to 10,000) were mixed at a ratio of 3:2 to give a mixture, which was then dissolved in a chlorobenzene (CB) solvent so that a solution concentration was 2.0 wt %, thereby preparing semiconductor ink.

The semiconductor ink thus prepared was stirred at 3,000 rpm for about 30 min on a hot plate at 50° C., thus obtaining semiconductor ink.

Table 1 below shows the solubility of the low-molecular-weight organic semiconductor, for example, C8-BTBT, and the high-molecular-weight organic semiconductor, for example, PTAA.

TABLE 1

| Compound | (Solubility parameter $(MP_a^{1/2})$ |
|---|---|
| C8-BTBT | 16.62 |
| PTAA | 23.1 |

Table 2 below shows the surface energy of the low-molecular-weight organic semiconductor, for example, C8-BTBT, and the high-molecular-weight organic semiconductor, for example, PTAA.

TABLE 2

| | Contact angle (°) | | Surface tension (mJ/m²) | | |
|---|---|---|---|---|---|
| Compound | DI water | Diiodomethane | $\gamma_s^d$ | $\gamma_s^p$ | $\gamma_s$ |
| C8-BTBT | 68 | 56 | 30.9 | 11.4 | 42.3 |
| PTAA | 91 | 22 | 47.2 | 0.3 | 47.5 |

Preparation Example 2: Preparation of Substrate Including Electrodes

Ti (2 nm)/Au (20 nm) electrodes were subjected to thermal evaporation through a patterned mask on a 2 cm×2 cm sized Si/SiO$_2$ 300 nm wafer substrate washed with acetone, isopropyl alcohol (IPA) and deionized water (DI water), thus forming source/drain electrodes. In order to increase the hydrophilicity of the Au—Ti/silicon wafer substrate, UV ozone treatment was performed for 15 min, thus manufacturing a substrate having source/drain electrodes formed thereon.

Example 1: Organic Semiconductor Thin Film Comprising Low-Molecular-Weight Organic Semiconductor Layer Formed on High-Molecular-Weight Organic Semiconductor Layer A thin film was manufactured through a wire bar-coating process, the gap of which was capable of being adjusted, using the semiconductor ink of Preparation Example 1. As a bar coater for the bar-coating process, a printed electro-mechanical system (PEMS) was used.

The substrate having source/drain electrodes of Preparation Example 2 was exposed to UV ozone for 15 min, whereby the substrate was made hydrophilic, after which 60 µL of the semiconductor ink blend of Preparation Example 1 was spread between the substrate and the wire bar. After moving by 1 mm under conditions of a gap of 2 µm and a coating speed of 1 mm/sec, a stationary phase for stopping the coating movement for 1 sec and a moving phase at a coating speed of 1 mm/sec were repetitively performed. The bar-coating process was conducted under the above conditions, thereby manufacturing a high-quality crystalline organic semiconductor thin film on the substrate having source/drain electrodes in a continuous process.

The organic semiconductor thin film was configured such that the low-molecular-weight organic semiconductor layer was formed on the high-molecular-weight organic semiconductor layer.

Example 2: Organic Semiconductor Thin Film Comprising High-Molecular-Weight Organic Semiconductor Layer Formed on Low-Molecular-Weight Organic Semiconductor Layer A thin film was manufactured through a wire bar-coating process, the gap of which was capable of being adjusted, using the semiconductor ink of Preparation Example 1. As a bar coater for the bar-coating process, a printed electro-mechanical system (PEMS) was used.

The substrate having source/drain electrodes of Preparation Example 2 was coated with an octadecyltrichlorosilane (OTS) self-assembled monolayer (SAM), after which 60 µL of the semiconductor ink blend of Preparation Example 1 was spread between the substrate and the wire bar. After moving by 1 mm under conditions of a gap of 2 µm and a coating speed of 1 mm/sec, a stationary phase for stopping the coating movement for 1 sec and a moving phase at a coating speed of 1 mm/sec were repetitively performed. The bar-coating process was conducted under the above conditions, thereby manufacturing a high-quality crystalline organic semiconductor thin film on the substrate having source/drain electrodes in a continuous process.

The organic semiconductor thin film was configured such that the high-molecular-weight organic semiconductor layer was formed on the low-molecular-weight organic semiconductor layer.

Device Example 1: Fabrication of Transistor Including Organic Semiconductor Thin Film The substrate including the organic semiconductor thin film of Example 1 was subjected to spin coating with poly(perfluorobutenylvinylether) (Cytop) diluted at a ratio of 1:5 at 3,000 rpm for 60 sec, and a Parylene thin film having a thickness of 300 nm was then subjected to vacuum thermal evaporation, thus manufacturing a stack comprising Parylene/Cytop/blended thin film/Au-Ti/silicon wafer. A gate electrode was thermally deposited with Al using a patterned mask on the substrate, thus fabricating an organic transistor including the organic semiconductor thin film of Example 1.

Comparative Example 1: Organic Semiconductor Thin Film Using Conventional Bar-Coating Process An organic semiconductor thin film was manufactured in the same manner as in Example 1, with the exception that a bar-coating process was performed through direct contact at a coating speed of 1 to 10 cm/sec, in lieu of the bar-coating process at a gap of 2 µm and a coating speed of 1 mm/sec.

Comparative Example 2: Organic Semiconductor Thin Film (at Large Gap)

An organic semiconductor thin film was manufactured in the same manner as in Example 1, with the exception that the gap was 100 to 200 µm, in lieu of the gap of 2 µm in Example 1.

TEST EXAMPLES

Test Example 1: Crystallinity of Thin Film Depending on Gap Size and Coating Bar Speed FIG. 2 shows the results of analysis of the crystal size of the organic semiconductor thin film depending on the size of a gap and on the speed of a wire bar.

Figure 2:
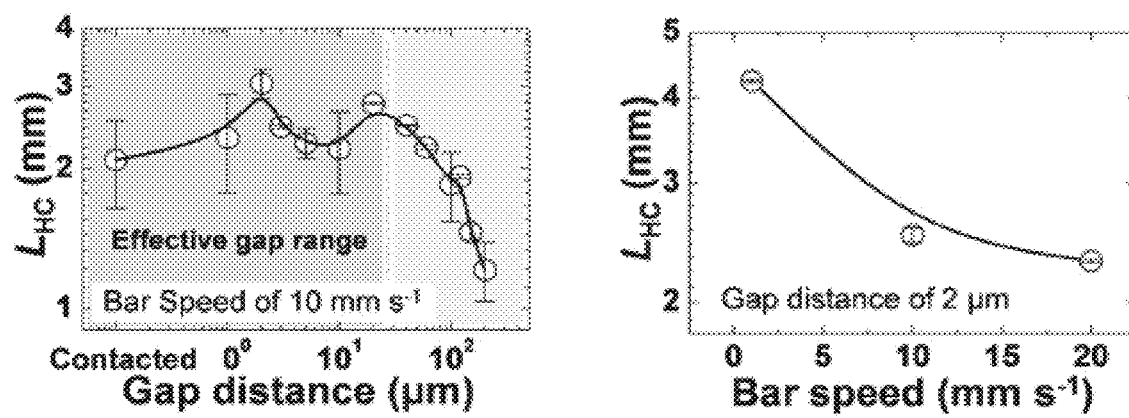
FIG. 2 shows the results of analysis of crystal size depending on the size of a gap and on the speed of a bar.
Figure 3:
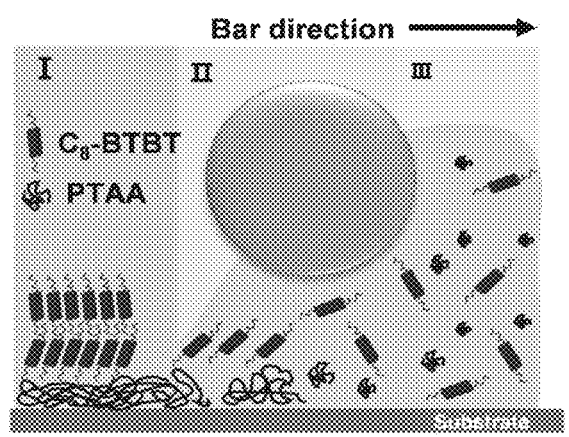
FIG. 3 shows a diagram of vertical phase separation occurring at the gap in the bar-coating process.

With reference to FIG. 2, when the speed of the wire bar was 10 mm/sec, a thin film having high crystallinity was formed with a decrease in the size of the gap, and a thin film having high crystallinity was formed with a decrease in the speed of the wire bar in the bar-coating process.

These results mean that the size of the gap and the speed of the bar should be controlled in order to manufacture a highly crystalline organic semiconductor thin film.

Test Example 2: Double-Layer Structure Through Vertical Phase Separation of Semiconductor Ink FIG. 4 shows a TEM (Transmission Electron Microscopy) image of the double-layer structure formed through vertical phase separation of the low-molecular-weight organic semiconductor and the high-molecular-weight organic semiconductor of the organic semiconductor thin film according to the present invention.

Figure 4:
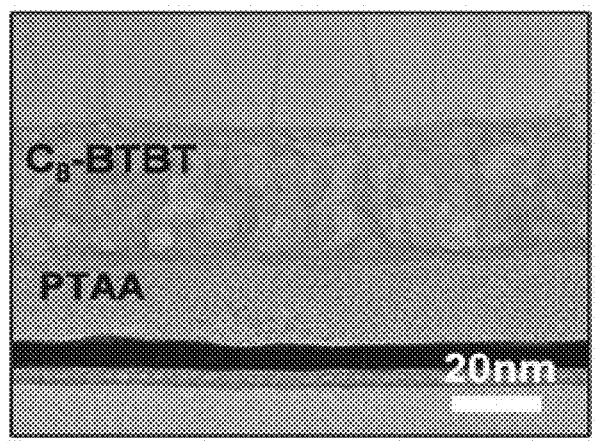
FIG. 4 shows a transmission electron microscopy (TEM) image of a double-layer structure formed through vertical phase separation of a low-molecular-weight organic semiconductor and a high-molecular-weight organic semiconductor in an organic semiconductor thin film according to the present invention.

With reference to FIG. 4, the organic semiconductor thin film configured such that the low-molecular-weight organic semiconductor C8-BTBT was formed on the high-molecular-weight organic semiconductor PTAA can be confirmed to be formed through vertical phase separation.

Thus, when vertical phase separation occurs while the semiconductor ink is crystallized, it can be confirmed to form the double-layer structure, in which the high-molecular-weight organic semiconductor having high surface energy is located at a lower position and the low-molecular-weight organic semiconductor having relatively low surface energy is located at an upper position.

Test Example 3: Extent of Vertical Phase Separation Depending on Gap Size

Figure 5:
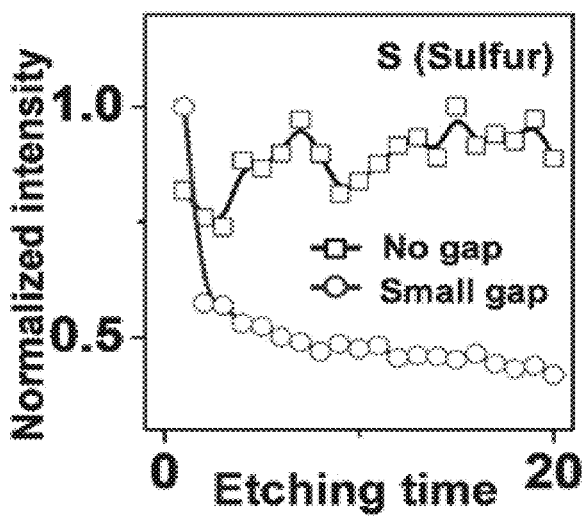
FIG. 5 shows the results of X-ray photoelectron spectroscopy (XPS) of the thin film depending on the size of the gap.

FIG. 5 shows the results of X-ray photoelectron spectroscopy (XPS) depending on the depth of the organic semiconductor thin films differently manufactured at different gap sizes, in which the extent of phase separation can be confirmed depending on the concentration distribution of sulfur contained in the low-molecular-weight organic semiconductor.

With reference to FIG. 5, the organic semiconductor thin film manufactured using a drop-casting process having no gap can be confirmed to distribute sulfur regardless of the depth thereof, which means that the low-molecular-weight organic semiconductor containing sulfur is distributed without vertical phase separation.

On the other hand, the organic semiconductor thin film of Example 1 can be confirmed to have high sulfur concentration at the surface thereof and low sulfur concentration at the deep portion thereof, which means that the low-molecular-weight organic semiconductor containing sulfur is layer-separated due to vertical phase separation and thus located at an upper position.

Accordingly, vertical phase separation can be found to vary depending on the presence of the gap.

Test Example 4: Image Analysis of Organic Semiconductor Thin Film Manufactured Through Bar-Coating Process of the Present Invention FIG. 6 schematically shows a coating process in which the speed control for controlling the moving phase and the stationary phase according to the present invention is programmed, and FIG. 7 shows POM (Polarized Optical Microscopy) images of the limited crystalline film using a conventional bar-coating process and the thin film using the bar-coating process according to the present invention.

Figure 6:
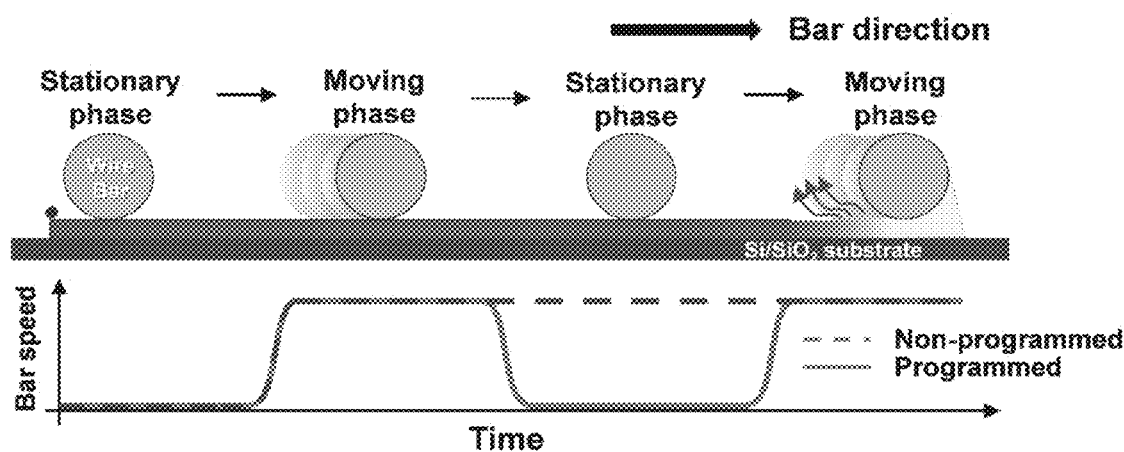
FIG. 6 schematically shows a coating process in which the stationary phase of the present invention is programmed.

With reference to FIG. 6, when using the coating process according to the present invention in which the speed control for controlling the moving phase and the stationary phase is programmed, the stationary phase is programmed before "slippage", whereby capillary force is prevented from exceeding pinning force, thus inducing continuous crystal growth.

Figure 7:
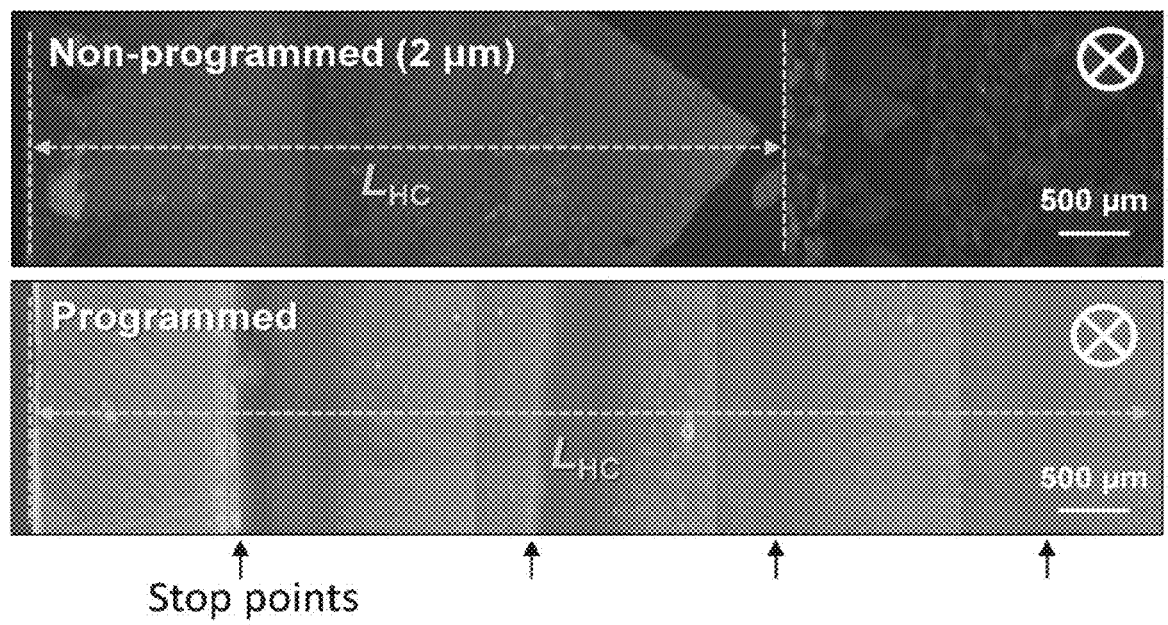
FIG. 7 shows POM images of a thin film through a conventional bar-coating process and a thin film formed through a bar-coating process of the present invention.

With reference to FIG. 7, the thin film formed using the bar-coating process in which the speed control for controlling the moving phase and the stationary phase is programmed can be confirmed to have a long crystal length and a large crystal size, and the thin film formed using the non-programmed bar-coating process can be confirmed to have a limited crystal length.

Accordingly, the speed is controlled in the bar-coating process of the present invention, thereby effectively controlling crystal growth and crystal size.

Test Example 5: Extent of Vertical Phase Separation Depending on Gap Size

Figure 8:
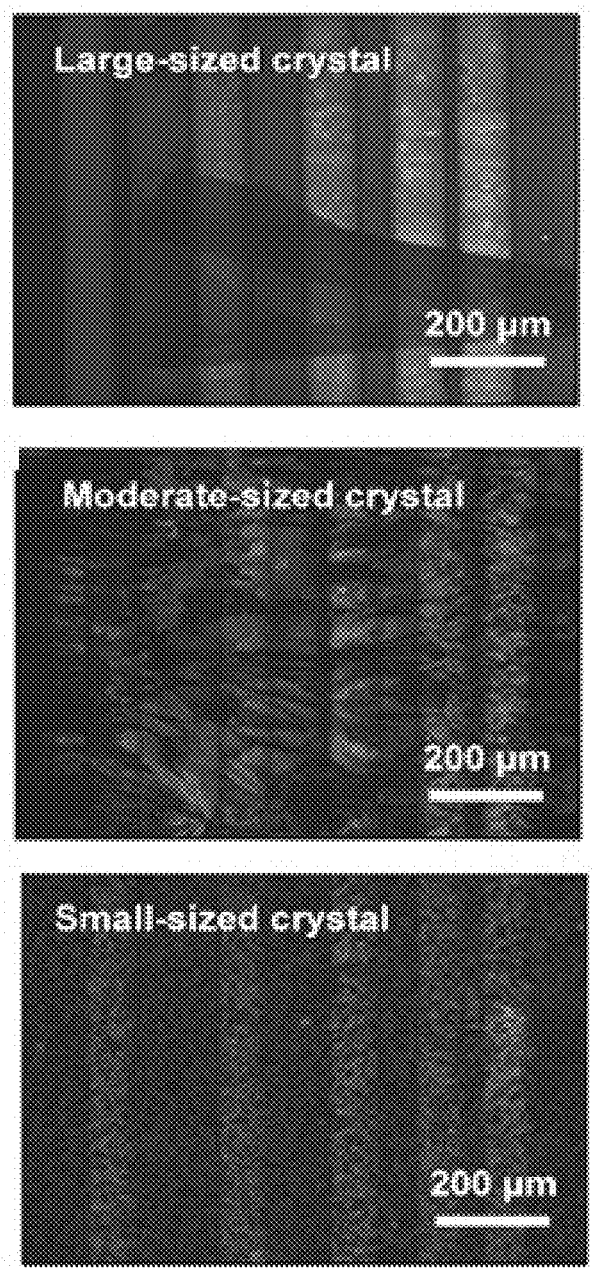
FIG. 8 shows POM images depending on the crystal size of the organic semiconductor thin film.

FIG. 8 shows POM images of the organic semiconductor thin film depending on the crystal size.

With reference to FIG. 8, the large crystal size was at least 1 to 2 mm, the moderate crystal size was 200 to 300 µm, and the small crystal size was about 5 µm.

Test Example 6: Analysis of Electrical Characteristics of Transistor Depending on Crystal Size of Organic Semiconductor Thin Film-1

Figure 9:
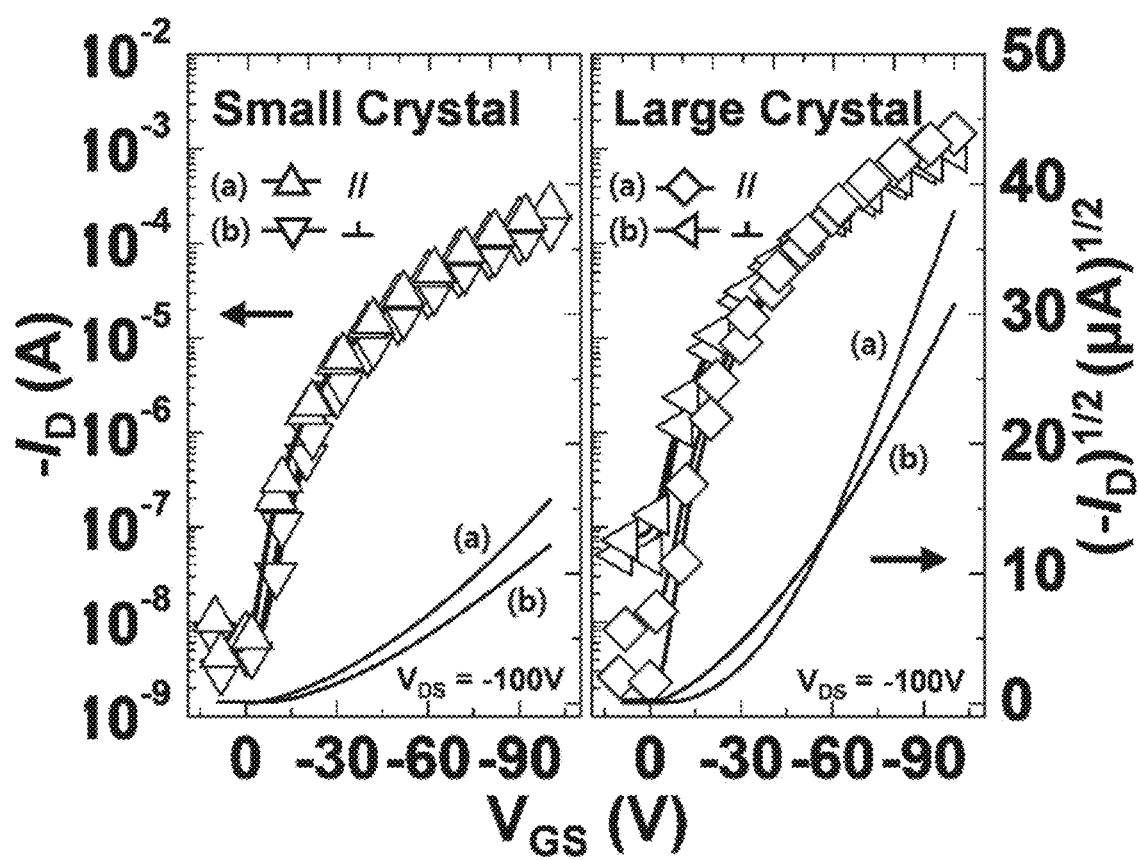
FIG. 9 is a graph showing the electrical characteristic transfer curve of an organic transistor including the organic semiconductor thin film according to the present invention.

FIG. 9 shows the results of analysis of electrical characteristics of the organic transistor depending on the crystal size of the organic semiconductor thin film at $V_{DS}$ of −100 V.

With reference to FIG. 9, the organic transistor including the organic semiconductor thin film having a large crystal size can be confirmed to have a high carrier mobility of 26.1 cm$^2$/Vs at a maximum and an on/off ratio of ~10$^7$.

Test Example 7: Analysis of Electrical Characteristics of Transistor Depending on Crystal Size of Organic Semiconductor Thin Film-2

Figure 10:
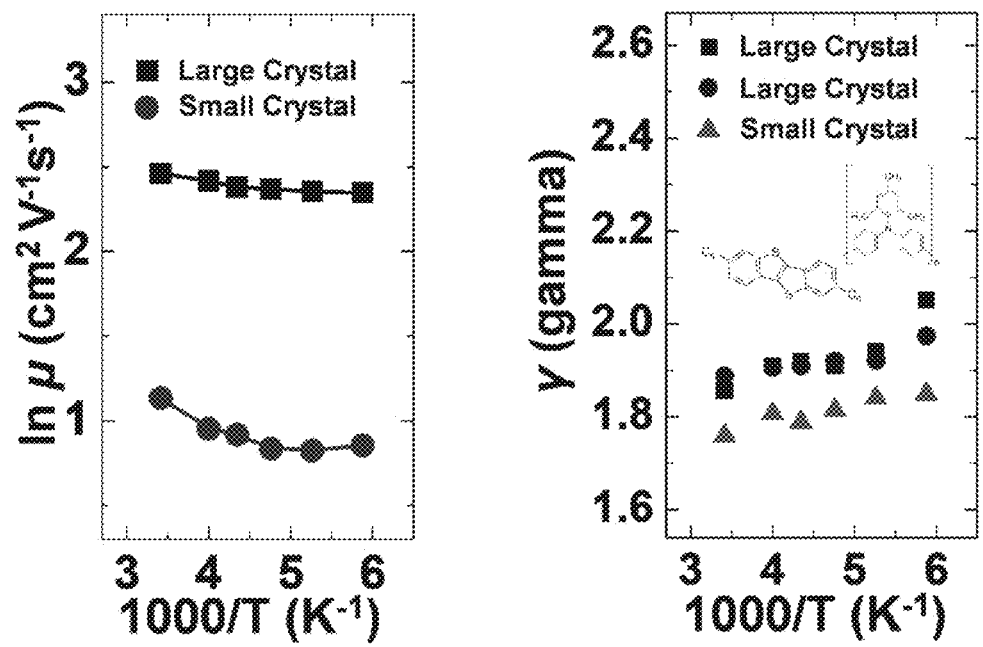
FIG. 10 is graphs showing changes in charge mobility and gamma changes depending on the device temperature of the organic semiconductor thin film according to the present invention.

FIG. 10 shows the results of analysis of charge mobility depending on the crystal size.

With reference to FIG. 10, as the crystal size increases, charges are transferred in a band-like manner, and thus charge mobility can be confirmed to be superior, unlike hopping transfer. Hopping charge transfer is deemed to occur because the grain boundary that interrupts charge transfer is increased with a decrease in the crystal size.

Thus, the crystal growth can be controlled using the bar-coating process of the present invention in order to improve the characteristics of the transistor including the organic semiconductor thin film.

Test Example 8: Changes in Electrical Characteristics of Organic Transistor Depending on Extent of Bending FIG. 11 is an image showing the bendability of the organic transistor of Device Example 1, and FIG. 12 shows the electrical characteristics depending on the extent of bending of the organic transistor of Device Example 1.

Figure 11:
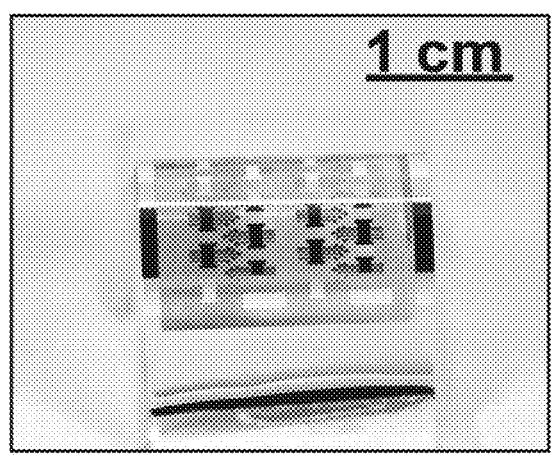
FIG. 11 is a photograph showing an organic semiconductor transistor including the organic semiconductor thin film according to the present invention having bending characteristics.
Figure 12:
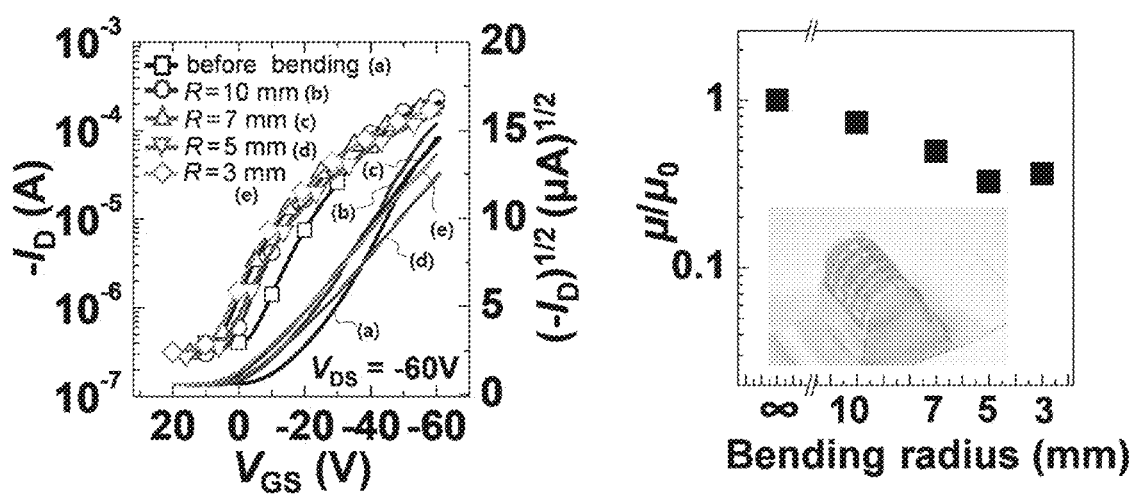
FIG. 12 is graphs showing electrical transfer characteristics depending on the extent of bending of the flexible organic semiconductor transistor including the organic semiconductor thin film according to the present invention.

With reference to FIGS. 11 and 12, the charge mobility of the organic transistor of Device Example 1 was similar before and after bending, and changes in charge mobility depending on the extent of bending were not great.

Typically, a highly crystalline organic semiconductor thin film is easily damaged by bending, but the organic semiconductor thin film according to the present invention was determined to have excellent bending stability.

Thus, the transistor of the present invention is evaluated to have good bendability and high bending stability.

The scope of the invention is represented by the claims below rather than the aforementioned detailed description, and all of the changes or modified forms that are capable of being derived from the meaning, range, and equivalent concepts of the appended claims should be construed as being included in the scope of the present invention.

What is claimed is:

1. A method of manufacturing an organic semiconductor thin film, comprising:
   (a) preparing semiconductor ink containing a solvent, a low-molecular-weight organic semiconductor and a high-molecular-weight organic semiconductor, wherein the low molecular-weight organic semiconductor has a molecular weight of 50 to 1,000 and the high-molecular-weight organic semiconductor has a molecular weight of 2,000 to 1,000,000; and
   (b) forming an organic semiconductor thin film that is vertically phase-separated by applying the semiconductor ink on a substrate through a bar-coating process using a bar.

2. The method of claim 1, wherein, in step (b), a size of a gap between the bar and the substrate is adjusted to thus control vertical phase separation of the organic semiconductor thin film.

3. The method of claim 1, wherein, in step (b), a movement speed of the bar during the bar-coating process is adjusted to thus control a crystal shape, a crystal size and/or a crystal growth rate of the organic semiconductor thin film.

4. The method of claim 1, wherein step (b) comprises:
   (b-1) performing coating at a movement speed of the bar ranging from 0.1 to 2 mm/sec (v1) during the bar-coating process; and
   (b-2) stopping movement of the bar after step (b-1) or performing coating at a movement speed of the bar ranging from 0.01 to 0.05 mm/sec.

5. The method of claim 1, wherein the organic semiconductor thin film comprises:
   a high-molecular-weight organic semiconductor layer formed on the substrate and configured to contain a high-molecular-weight organic semiconductor; and
   a low-molecular-weight organic semiconductor layer formed on the high-molecular-weight organic semiconductor layer and configured to contain a low-molecular-weight organic semiconductor,
   the low-molecular-weight organic semiconductor layer being crystalline.

6. The method of claim 1, wherein, in step (b), vertical phase separation and crystal growth occur while the solvent of the semiconductor ink evaporates.

7. The method of claim 1, wherein crystals of the low-molecular-weight organic semiconductor are arranged in a direction of movement of the bar.

8. The method of claim 1, wherein vertical phase separation is controlled using a difference between surface energy of the low-molecular-weight organic semiconductor and surface energy of the high-molecular-weight organic semiconductor,
   the substrate is hydrophilic, a first organic semiconductor layer containing an organic semiconductor having relatively high surface energy among the high-molecular-weight organic semiconductor and the low-molecular-weight organic semiconductor is formed on the substrate, and a second organic semiconductor layer containing an organic semiconductor
   having relatively low surface energy is formed on the first organic semiconductor layer, or the substrate is hydrophobic, a second organic semiconductor layer containing an organic semiconductor having relatively low surface energy among the high-molecular-weight organic semiconductor and the low-molecular-weight organic semiconductor is formed on the substrate, and a first organic semiconductor layer containing an organic semiconductor having relatively high surface energy is formed on the second organic semiconductor layer.

9. The method of claim 1, wherein the low-molecular-weight organic semiconductor is a compound represented by Structural Formula 1 below:

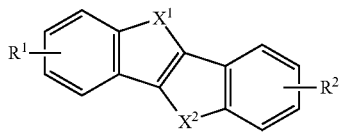

[Structural Formula 1]

in Structural Formula 1,

X1 and X2 are the same as or different from each other, and are each independently an oxygen (O), sulfur (S), nitrogen (N), phosphorus (P) or selenium (Se) atom, and R1 and R2 are the same as or different from each other, and are each independently a hydrogen atom, a C1 to C30 linear or branched alkyl group, or a C6 to C30 aryl group.

10. The method of claim 1, wherein the low-molecular-weight organic semiconductor includes at least one selected from among a pentacene derivative compound and a TES-ADT (5,11-bis(triethylsilylethynyl)anthradithiophene) derivative compound.

11. The method of claim 1, wherein the high-molecular-weight organic semiconductor is a compound represented by Structural Formula 2 below:

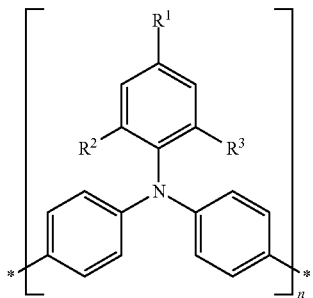

[Structural Formula 2]

in Structural Formula 2, $R^1$ to $R^3$ are the same as or different from each other, and are each independently a hydrogen atom, a C1 to C30 linear or branched alkyl group, or a C6 to C30 aryl group, $R^4$ and $R^5$ are the same as or different from each other, and are each independently a hydrogen atom, a C1 to C30 linear or branched alkyl group, or a C6 to C30 aryl group, and n is any one integer of 1 to 50.

12. The method of claim 1, wherein the high-molecular-weight organic semiconductor includes at least one selected from among poly(triaryl amine) (PTAA), indacenodithiophene-co-benzothiadiazole (IDT-BT), and poly(9,9-dioctyl-fluorene-alt-bithiophene) (F8T2).

13. The method of claim 2, wherein a thickness, a flow rate and a phase separation of the semiconductor ink are controlled depending on the size of the gap.

14. The method of claim 2, wherein the size of the gap is 0.01 to 10 μm.

15. The method of claim 3, wherein the speed of the bar during the bar-coating process is 0.05 to 2 mm/sec.

16. The method of claim 4, wherein steps (b-1) and (b-2) are sequentially or continuously repeated.

17. The method of claim 6, wherein a crystal growth rate is controlled by adjusting an evaporation rate of the solvent.

18. A method of fabricating an organic transistor, comprising:

(a) preparing semiconductor ink containing a solvent, a low-molecular-weight organic semiconductor and a high-molecular-weight organic semiconductor, wherein the low molecular-weight organic semiconductor has a molecular weight of 50 to 1,000 and the high-molecular-weight organic semiconductor has a molecular weight of 2,000 to 1,000,000;

(b) providing a substrate and forming source and drain electrodes on the substrate;

(c) forming an organic semiconductor thin film that is vertically phase-separated by applying the semiconductor ink on the substrate having the source and drain electrodes formed thereon through a bar-coating process using a bar;

(d) forming an insulating layer on the organic semiconductor thin film; and (e) forming a gate electrode on the insulating layer.

* * * * *